(12) United States Patent
Karthaus (10) Patent No.: US 8,830,107 B1
(45) Date of Patent: Sep. 9, 2014

(54) FREQUENCY TRANSLATING ANALOG-TO-DIGITAL CONVERTER

(71) Applicant: Udo Karthaus, Neu-Ulm (DE)

(72) Inventor: Udo Karthaus, Neu-Ulm (DE)

(73) Assignee: Udo Karthaus, Neu-Ulm (DE)

( * ) Notice: Subject to any disclaimer, the term of this patent is extended or adjusted under 35 U.S.C. 154(b) by 0 days.

(21) Appl. No.: 13/863,387

(22) Filed: Apr. 16, 2013

(51) Int. Cl.
*H03M 1/12* (2006.01)
(52) U.S. Cl.
USPC ........... 341/155; 341/143; 375/219; 375/247; 375/298; 375/261; 375/263; 375/295; 375/270; 375/259; 327/557; 327/558; 455/296; 455/249.1; 455/250.1
(58) Field of Classification Search
CPC ......... H03M 3/02; H03M 3/42; H03M 3/394; H03M 3/408; H03M 3/424; H03M 3/452; H03M 3/454; H03M 3/40; H04B 1/30; H04B 1/124; H04B 1/40; H04B 1/28; H04B 1/0003; H04B 1/0007; H03F 3/24; H03D 3/007; H03D 3/163; H03D 3/0028; H03L 7/18
USPC ............ 341/118–155; 455/296, 249.1, 250.1; 327/557, 558; 708/307; 375/219, 270, 375/247, 298, 261, 264, 295, 259
See application file for complete search history.

(56) References Cited

U.S. PATENT DOCUMENTS

| | | | |
|---|---|---|---|
| 5,751,051 A * | 5/1998 | Hayano | 257/546 |
| 5,757,300 A * | 5/1998 | Koilpillai et al. | 341/143 |
| 6,738,609 B1 * | 5/2004 | Clifford | 455/296 |
| 6,741,650 B1 * | 5/2004 | Painchaud et al. | 375/240.21 |
| 6,765,517 B1 * | 7/2004 | Ali | 341/143 |
| 6,990,155 B2 * | 1/2006 | Adachi et al. | 375/298 |
| 7,034,728 B2 * | 4/2006 | Luh et al. | 341/143 |
| 7,856,048 B1 * | 12/2010 | Smaini et al. | 375/221 |
| 7,916,056 B2 * | 3/2011 | Son | 341/143 |
| 7,936,293 B2 * | 5/2011 | Hamashita | 341/143 |
| 7,962,112 B2 * | 6/2011 | Sandner et al. | 455/241.1 |
| 8,384,574 B2 * | 2/2013 | Karthaus et al. | 341/143 |
| 8,559,488 B1 * | 10/2013 | Smaini et al. | 375/221 |

* cited by examiner

*Primary Examiner* — Lam T Mai (57) ABSTRACT

A frequency translating analog-to-digital converter for receiving an analog band-pass signal is described. The analog-to-digital converter comprises an adder/input block for receiving the analog band-pass signal and an analog band-pass feedback signal, thereby forming an analog band-pass error signal. The analog-to-digital converter has at least one analog mixer for mixing and down converting the analog band-pass error signal and thus generating a down-converted analog error signal and at least one quantization path for generating at least one digital signal. The quantization path is adapted to be fed with the down-converted analog error signal and to output the at least one digital signal, and comprises at least one of an inner feedback path for feeding back the at least one digital signal to the at least one filter element or a feed forward path for feeding forward the down-converted analog error signal feeding to the at least one filter element, wherein the inner feedback path comprises an inner digital-to-analog converter. An outer common feedback path is provided for feeding the at least one digital signal back to the adder block, the outer feedback path comprising a digital-to-analog converter, to convert the at least one digital signal into an analog band-pass feedback signal.

19 Claims, 5 Drawing Sheets

FREQUENCY TRANSLATING ANALOG-TO-DIGITAL CONVERTER

SUMMARY OF THE INVENTION

The invention relates to a frequency translating analog-to-digital converter for receiving an analog band-pass signal, and a method for processing an analog band-pass signal.

CROSS REFERENCE TO RELATED APPLICATIONS

None.

BACKGROUND OF THE INVENTION

An analog-to-digital converter for processing an analog band-pass signal, to yield a digital base band signal needs to perform two principal tasks: down-conversion (frequency translation) and analog-to-digital conversion. The band-pass signal can be a one of a band-pass signal or an intermediate frequency signal. Many known receivers perform the down-conversion (or at least a significant part of the down-conversion) in the analog domain using analog circuitry. More recent receivers tend to shift the analog-to-digital conversion towards the intermediate frequency or the radio frequency (RF) front end. This development has been made possible by advances in the technology of analog-to-digital converters.

One of the types of analog-to-digital converters that has been found to be suitable for the processing of analog intermediate frequency or RF signals is a delta-sigma modulator type of analog-to-digital converters. The article "Excess Loop Delay Effects in Continuous-Time Delta-Sigma Modulators and the Compensation Solution", Weinan Gao et. all, 1997 IEEE International Symposium on Circuits and Systems, Jun. 9-12, 1997, Hong Kong (hereafter referred to as "GAO") describes a receiver/analog-to-digital converter with a band-pass delta-sigma modulator (BPDSM). The band-pass delta-sigma modulator is clocked at 3.6 GHz and is used to receive a 900 MHz RF analog signal, i.e. the clock frequency of the delta-sigma modulator is four times higher than the frequency of the received RF analog signal. This so called 4:1 mode is often used for analog-to-digital converters, because samples from the analog signal can be taken at RF carrier phases of 0°, 90°, 180°, and 270°. The corresponding sampling instances are +I, +Q, −I, −Q samples. Another common frequency ratio is 4:3, where the samples are taken at RF carrier phases of 0°, 270°, 180°, and 90° (i.e. sampling instances are +I, −Q, −I, +Q).

It would be desirable to provide for an analog-to-digital converter (ADC) that allows for a high dynamic range. It would be further desirable to provide for an ADC with low power consumption. It would be further desirable to provide for an ADC with high image rejection.

SUMMARY OF THE INVENTION

These and other objects are solved by a frequency translating analog-to-digital converter (ADC) for receiving an analog band-pass signal, comprising an adder/input block for receiving the analog band-pass signal and an analog band-pass feedback signal, thereby forming an analog band-pass error signal, at least one analog mixer block for down-converting the analog band-pass error signal, thus generating at least one down-converted analog error signal, at least one quantization path for generating at least one digital signal, wherein the at least one quantization path comprises at least one filter element, at least one quantizer for generating at least one digital signal, at least one of an inner feedback path for feeding back the at least one digital signal to the at least one filter element, wherein the inner feedback path comprises an inner digital-to-analog converter (DAC), or of a feed forward path for feeding forward the down-converted analog error signal to the at least one filter element; an outer common feedback path for feeding the at least one digital signal back to the adder/input block, the outer feedback path comprising a outer digital-to-analog converter, to convert the at least one digital signal into a band-pass analog feedback signal.

The present disclosure therefore teaches a frequency translating ADC with both, an inner feedback loop or a feed-forward loop for the quantization path and an outer feedback loop, therefore providing a high dynamic range together with a high image rejection.

In one aspect of the present disclosure, the filter element is an integrator.

In another aspect of the present disclosure, the outer feedback path comprises a digital up-converter and an outer digital-to-analog converter.

In another aspect of the present disclosure, the frequency translating ADC comprises at least one filter element connected to the at least one mixer and to the at least one quantization path.

In yet another aspect of the disclosure, a ratio of the clock frequency of the outer feedback DAC to the band-pass frequency is one of approximately 4:1, 3:1, 3:2 or 4:3.

The frequency translating ADC in one aspect of the disclosure comprises an in-phase mixer for providing an in-phase down-converted component and a quadrature mixer for providing a quadrature down-converted component, and an in-phase quantization path for providing an in-phase delta sigma modulated signal component and a quadrature quantization path for providing a quadrature delta sigma modulated signal component.

The frequency translating ADC in another aspect of the disclosure comprises a multi-path mixer for providing at least three analog down-converted signals with at least three different phases, and at least three quantization paths for providing at least three delta sigma modulated signal components with at least three different phases, one quantization path for each down-converted signal of the multi-path mixer.

The frequency translating ADC in another aspect of the disclosure comprises a multi-path mixer for providing at least four analog down-converted signals with at least four different phases, and at least two quantization paths for providing at least two delta sigma modulated signal components with at least two different phases, one quantization path for each pair of down-converted signals of the multi-path mixer.

The quantization path may comprise at least one filter element followed by a quantizer. In another aspect of the disclosure, the quantization path comprises a first filter element followed by a second filter element, and the inner feedback path is adapted to feed back the digital output signal on an input of the first filter element and on an input of the second filter element.

The frequency translating ADC may comprise at least one of a low-pass delta-sigma modulator/quantization path and a low intermediate frequency delta-sigma modulator/quantization path.

The frequency translating ADC may comprise at least one low intermediate frequency delta-sigma modulator.

The frequency translating ADC may comprise at least one multi-path mixer.

The analog-to-digital converter comprises at least one decimation filter connected to the output of the at least one quantization path.

Preferably, the analog-to-digital converter is implemented on a chip using CMOS or SiGe technology.

The outer common feedback path with a common feedback digital-to-analog converter allows the suppression of the image reception by the outer common feedback path.

The system of the present disclosure does not use LC resonators, which are for examples used in GAO, and which are otherwise non-linear, noisy components requiring active Q enhancements. By avoiding LC resonators, the Q enhancement is not needed. The use of low-pass or low intermediate frequency quantization paths enables a large dynamic range, whilst maintaining low power consumption. This is because inductors cannot be made arbitrary large (=high impedance), in practice limited to approximately 10 nH. So a significant current is needed to obtain a reasonably high voltage swing. In contrast, capacitors—used to realize integrators according to this disclosure—can easily be made very small (=high impedance), so that reasonably high voltage swing can be obtained at arbitrarily low drive current. The calibration required with LC resonators is not needed, which allows an easy use with less risks than with a prior art system where calibration is needed. The size of the chips used in the system may further be reduced, since the real estate covered by integrated inductors often dominates the total available real estate on a semiconductor chip.

The present disclosure also teaches a method for processing an analog band-pass signal, comprising the steps of receiving, at an input block, the analog band-pass signal and a feedback signal to form an analog band-pass error signal; down-converting the analog band-pass error signal to produce a down-converted analog error signal; delta sigma modulating, by at least one quantization path, the down-converted analog error signal to produce a digital output signal, wherein the delta sigma modulating comprises at least one of feeding back the digital signal into the quantization path, or of feeding forward the analog band-pass error signal to the at least one filter element; feeding back the digital output signal as the feedback signal to the input block.

These and other aspects of the invention will be apparent from and elucidated with reference to the embodiment(s) described hereinafter.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
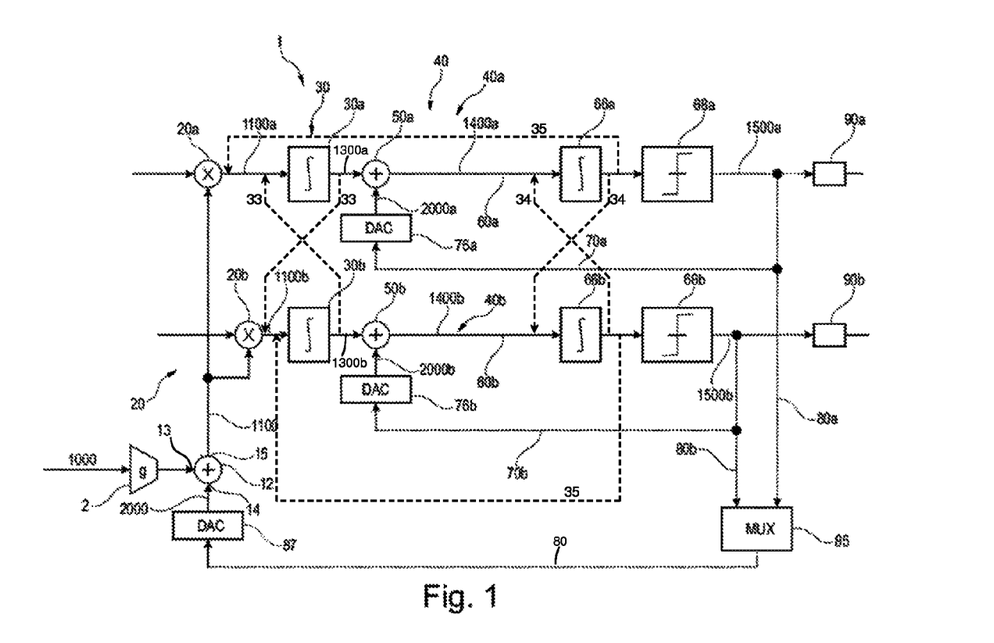
FIG. 1 shows a schematic block diagram of an analog-to-digital converter according to one aspect of the disclosure.

FIG. 1 shows a schematic block diagram of an analog-to-digital converter 1 for receiving an analog band-pass signal according to one aspect of the invention.

The analog-to-digital converter 1 comprises a transconductance 2 for providing the analog band-pass signal 1000 in the form of a current. The output of the transconductance 2 is connected to an adder/input block 12. The adder 12 has an analog RF signal input 13 for receiving the analog band-pass signal 1000 and a feedback signal input 14 for receiving an outer feedback signal 2000, as will be explained later. The adder 12 is adapted for summing or subtracting the outer feedback signal 2000 from the analog receive signal 1000, to form an analog band-pass error signal 1100.

The adder 12 has an output 15 connected to a mixer block 20 for down converting the analog band-pass error signal 1100 into baseband or low intermediate frequency, thereby providing an analog band-pass error signal 1100a, 1100b. The mixer block 20 of FIG. 1 is an analog complex in phase and quadrature mixer block 20 with an in-phase mixer 20a for providing an in-phase down-converted input component 1100a and a quadrature mixer 20b for providing a quadrature down-converted input component 1100b. The mixer block 20 can as well be realized as a multi-path mixer, as will be shown in FIG. 6 and FIG. 7. The mixer block 20 can as well be realized by the circuit of FIG. 5.

The outputs of the mixer block 20 are connected to an integrator block 30. The output of the in-phase mixer 20a is connected to an in-phase integrator 30a and the output of the quadrature mixer 20b is connected to a quadrature integrator 30b. Optionally, coupling paths 33 from the output of integrator 30a to the input of integrator 30b and vice versa can be introduced to move the noise shaping properties from baseband to an intermediate frequency. Equivalently, coupling paths 34 from the output of integrator 66a to the input of integrator 66b and vice versa can be introduced for the same purpose. In this case, the two quantization paths 40a, 40b form a single-sideband IF delta sigma modulator. Alternatively, coupling paths 35 from the output of integrators 66a, 66b to the input of integrators 30a, 30b can be introduced to move the noise shaping properties from base-band to an intermediate frequency.

The output of the in-phase integrators 30a is connected to an in-phase quantization path (or delta sigma modulator) 40a for providing an in-phase delta sigma modulated signal component 1500a and the output of the and the quadrature integrator 30b is connected to a quadrature quantization path (or delta sigma modulator) 40b for providing a quadrature delta sigma modulated signal component 1500b.

Each of the quantization paths 40a and 40b comprise a delta sigma modulator adder 50a and 50b, an integrator 66a, 66b followed by a quantizer 68a, 68b, to generate a digital baseband signal 1500a, 1500b, and an inner feedback path 70a and 70b.

The delta sigma modulator adder 50a, 50b is adapted to sum the filtered down-converted analog error signal component 1300a, 1300b and an inner feedback signal 2000a, 2000b, and to output an updated input signal 1400a, 1400b to the at least one filter element 66a, 66b.

In the embodiment of FIG. 1, the quantization path 40a, 40b is of the first order and comprises an integrator 66a, 66b followed by a quantizer 68a, 68b. However, this is not a limiting example. The quantization path may be of different orders with different stages of integration, as will be described later with reference to FIG. 2. Also, integrators 66a, 66b can be replaced by other types of filter elements, e.g. resonators resonating at a low intermediate frequency.

The digital signal 1500a, 1500b is fed back on the inner feedback path 70a, 70b for feeding back the digital signal 1500a, 1500b as an analog inner feedback signal 2000a, 2000b to the at least one filter element 66a, 66b, at the delta sigma modulator adder 50a, 50b. The inner feedback path 70a, 70b therefore comprises an inner digital-to-analog converter 76a, 76b for converting back the digital signal 1500a, 1500b into the analog feedback signal 2000a, 2000b.

The digital signal 1500a, 1500b is also fed on an outer feedback path 80a, 80b for feeding back, to the adder 12, the digital signals 1500a, 1500b as the analog band-pass feedback signal 2000. The outer feedback path 80a, 80b therefore comprises an up-converter digital mixer 82a, 82b followed by a multiplexer 85 for multiplexing the digital signals 1500a, 1500b and placing them on the common outer feedback path 80. The multiplexer 85 is followed a digital-to-analog converter 87 for converting the multiplexed baseband digital signal into said analog band-pass feedback signal 2000.

Figure 2:
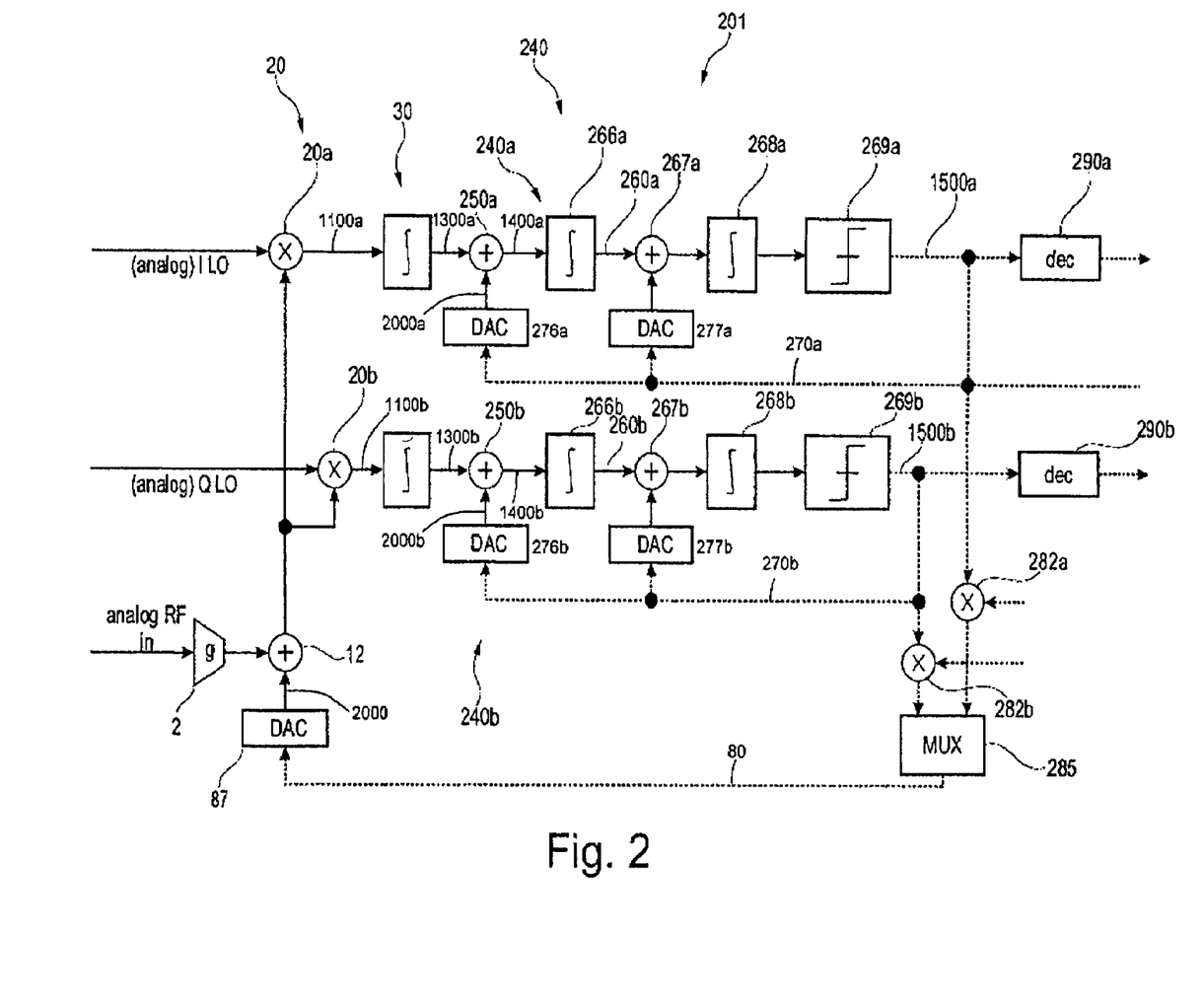
FIG. 2 shows a schematic block diagram of an analog-to-digital converter according to another aspect of the disclosure.

The outer feedback loop formed from the outer feedback path 80a, 80b is adapted for digitally up-converting the digital output signals 1500a, 1500b from baseband (or low intermediate frequency signal) to the original frequency band, e.g. a radio frequency or intermediate frequency. This frequency up-conversion can either be done explicitly by a digital mixer, multiplying the baseband signal with a digital local oscillator (LO) signal, or implicitly by sub-sampling or aliasing. An example of explicit up-conversion is shown in FIG. 2, while implicit up-conversion is assumed e.g. in FIG. 3. Explicit up-conversion is typically used in embodiments in which a ratio of clock frequency to RF frequency is 4:1 or 4:3. Implicit up-conversion occurs, for example, in embodiments in which a ratio of clock frequency to RF frequency is 3:1 or 3:2.

The analog-to-digital converter 1 according to the present disclosure comprises two feedback loops, an inner feedback loop, formed from feedback paths 70a and 70b, and an outer, frequency translating loop formed from the outer feedback path 80a, 80b and 80. The quantization paths 40a and 40b in the analog-to-digital converter further provide for a high dynamic range whilst keeping low power consumption. The presence of two feedback loops and of the delta sigma modulators allows greatly improving the range and image rejection of the receiver/analog-to-digital converter.

The digital-to-analog converter 87 is common on the outer feedback path 80. There is no separate hardware for in-phase and quadrature signals in the outer feedback path 80. This allows for suppression of image reception, which is normally observed in mixer blocks 20.

The person skilled in the art will also note that the delta sigma modulators (quantization paths) 40a and 40b in the analog-to-digital converter 1 are robust. The fact that no LC resonators are required reduces the need for calibration. This in turn provides for an easy use, with less risk of errors due to calibration mistakes. The fact that no LC resonators are required also reduces DC power consumption and performance variation over temperature, since no Q-enhancement circuits are needed. In addition, die size is lower without integrated inductors.

FIG. 1 shows a single feedback DAC 87 in the outer feedback loop. However, in one aspect of the invention, this DAC 87 is internally realized as two DACs, receiving essentially the same digital feedback signal, but producing analog output signals with different delay and/or different pulse shape, like return-to-zero (RZ), non-return to zero (NRZ) or half return to zero (HRZ), as described in GAO. By adjusting the relative gain and/or polarity of two such DACs, excess loop delay can be compensated, and the noise transfer function can be tuned.

FIG. 2 shows a schematic block diagram of an analog-to-digital converter 201 for receiving an analog band-pass signal according to another aspect of the invention. The analog-to-digital converter 201 of FIG. 2 mainly differs from the analog-to-digital converter 1 of FIG. 1 by an order of the delta sigma modulators/quantization paths. In view of the similarities between the embodiments of FIGS. 1 and 2, only the differences will be explained in the following paragraphs.

The analog-to-digital converter 201 comprises a complex delta sigma modulator block 240, with an in phase quantization path (or delta sigma modulator) 240a and a quantization path (or delta sigma modulator) 240b. Each of the quantization path (or delta sigma modulator) 240a, 240b comprises a delta sigma modulator adder or summation point 250a, 250b, a first integrator 266a, 266b followed by a second adder 267a, 267b, a second integrator 268a, 268b and a quantizer 269a, 269b, to generate a digital baseband signal 1500a, 1500b, and an inner feedback path 270a, 270b.

The delta sigma modulator adder 250a, 250b is adapted to sum the filtered down-converted analog error signal component 1300a, 1300b and an inner feedback signal 2000a, 2000b, and to output an updated input signal 1400a, 1400b to the at least one filter element 266a, 266b.

The digital signal 1500a, 1500b is fed back on an inner feedback path 270a, 270b for feeding back the digital signal 1500a, 1500b as an analog inner feedback signal 2000a, 2000b to the at least one filter element 266a, 266b, at the delta sigma modulator adder 250a, 250b and at the second adder 267a, 267b.

The inner feedback path 270a, 270b therefore comprises a first inner digital-to-analog converter 276a, 276b connected to the second adder 267a, 267b, and a second inner digital-to-analog converter 277a, 277b connected to the delta sigma modulator adder or summation point 250a, 250b. The first and second inner digital-to-analog converters 276a, 276b, 277a, 277b are adapted for converting back the digital signal 1500a, 1500b into the analog feedback signal 2000a, 2000b.

Therefore, two stages of integration are provided within the quantization path 240a, 240b.

A decimation filter 290a, 290b is connected to the outputs of the quantization paths 240a, 240b. The aim of the decimation filter is to generate, from the in-phase delta sigma modulated signal component 1500a and the quadrature delta sigma modulated signal component 1500b, respectively, the output signals at a required data rate and resolution. The person skilled in the art will understand that the decimation filter is optional.

In the example of FIG. 2, digital up-conversion mixers 282a, 282b are provided on the outer feedback path 80 for up converting the digital signal 1500a, 1500b before multiplexing by the multiplexer 285.

Figure 3:
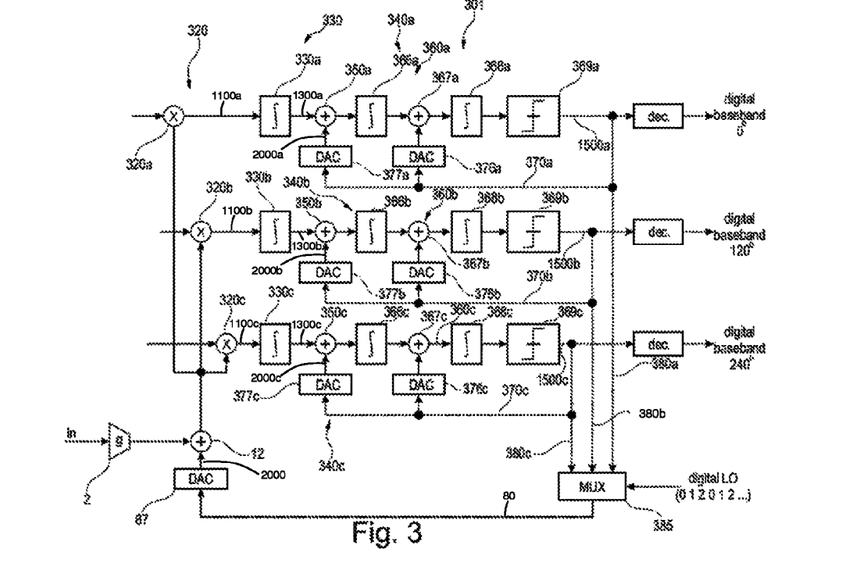
FIG. 3 shows a schematic block diagram of an analog-to-digital converter according to yet another of the aspect disclosure.

FIG. 3 shows a schematic block diagram of an analog-to-digital converter 301 for receiving an analog band-pass signal according to another aspect of the invention. The analog-to-digital converter 301 of FIG. 3 differs from the analog-todigital converter of FIGS. 1 and 2 essentially in that the analog-to-digital converter 301 comprises three quantization paths working at three different phases. The ratio of clock frequency to baseband input frequency of the analog-to-digital converter is approximately 3:1 or 3:2 in FIG. 3, whereas the two quantization paths in FIGS. 1 and 2 were complex I/Q modulation blocks.

Figure 6:
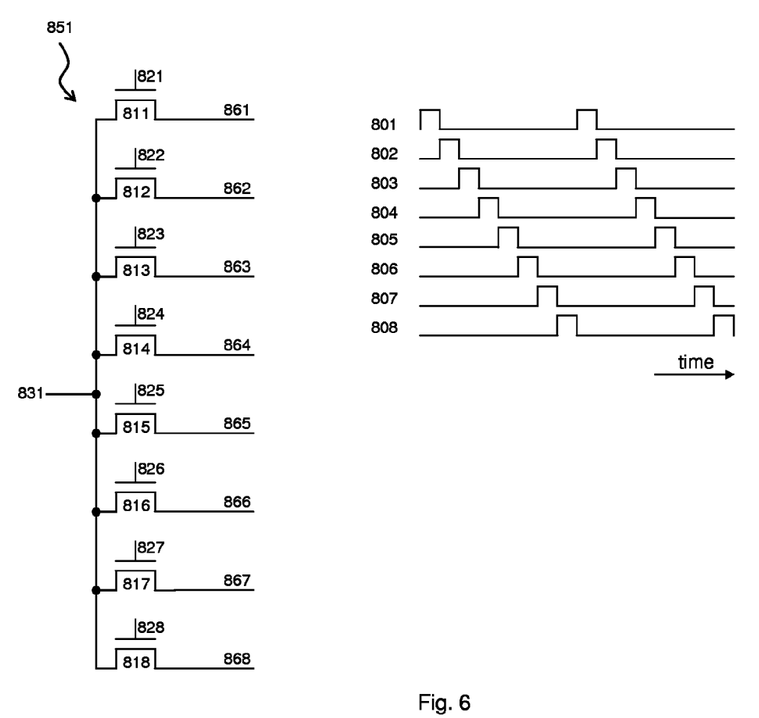
FIG. 6 shows a schematic block diagram of another possible mixer implementation which can be used with an analog-to-digital converter according to the disclosure.
Figure 7:
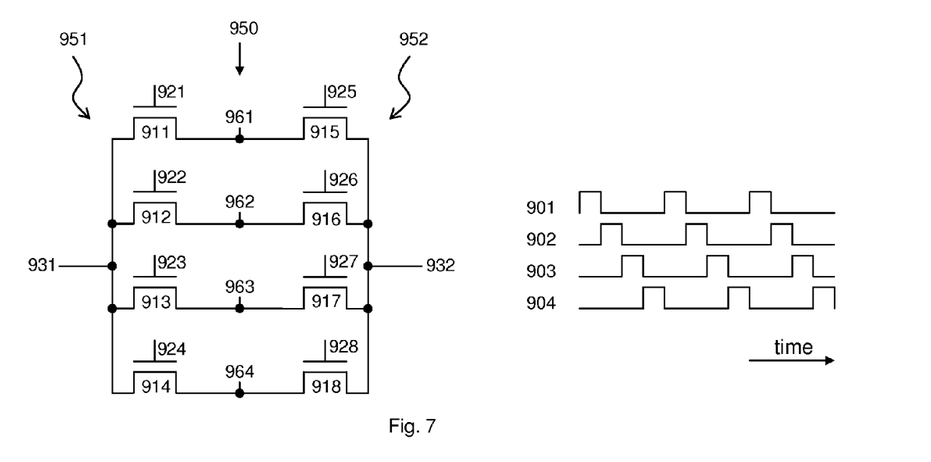
FIG. 7 shows a schematic block diagram of yet another possible mixer implementation which can be used with an analog-to-digital converter according to the disclosure.

The mixer block 320 of FIG. 3 is a three phase mixing block 320 with a zero phase mixer 320a, a 120 degree phase mixer 320b and a 240 degree phase mixer 320c for providing respectively a first signal component with a zero degree phase, a second signal component with a 120 degree phase, and a third component with a 240 degree phase. Such a mixer block 320 can be realized as a multi-path mixer as shown in FIG. 6 and FIG. 7.

The outputs of the mixer block 320 are connected to an integrator block 330, respectively to a first integrator 330a, a second integrator 330b, and a third integrator 330c. The outputs of the integrators 330a, 330b, 330c are connected to three corresponding quantization paths 340a, 340b, 340c, respectively.

Each of the quantization paths 340a, 340b, 340c comprises a delta sigma modulator adder 350a, 350b, 350c, a first integrator 366a, 366b, 366c followed by a second adder 367a, 367b, 367c, a second integrator 368a, 368b, 368c and a quantizer 369a, 369b, 369c, to generate a digital baseband signal 1500a, 1500b, 1500c, and an inner feedback path 370a, 370b, 370c.

The delta sigma modulator adder 350a, 350b, 350c is adapted to sum the filtered down-converted analog error signal component 1300a, 1300b, 1300c and an inner feedback signal 2000a, 2000b, 2000c and to output an updated input signal to the at least one filter element 366a, 366b, 366c.

The digital signal 1500a, 1500b, 1500c is fed back on an inner feedback path 370a, 370b, 370c for feeding back the digital signal 1500a, 1500b, 1500c as an analog inner feedback signal 2000a, 2000b, 2000c to the at least one filter element 360a, 360b, 360c, at the delta sigma modulator adder 350a, 350b, 350c and at the second adder 367a, 367b, 367c.

The inner feedback path 370a, 370b, 370c therefore comprises a first inner digital-to-analog converter 376a, 376b, 376c connected to the second adder 367a, 367b, 367c and a second inner digital-to-analog converter 377a, 377b, 377c connected to the delta sigma modulator adder or summation point 350a, 350b, 350c. The first inner digital-to-analog converter 376a, 376b, 376c and second inner digital-to-analog converter 377a, 377b, 377c are adapted for converting back the digital signal 1500a, 1500b, 1500c into the analog feedback signal 2000a, 2000b, 2000c.

Two stages of integration are provided within the quantization path 340a, 340b, 340c in the analog-to-digital converter of FIG. 3. However, this is optional, and as many stages of integration as desired may be provided.

The digital signal 1500a, 1500b, 1500c is also fed on an outer feedback path 380a, 380b, 380c for feeding back, to the adder 12, the digital signals 1500a, 1500b, 1500c as the analog feedback signal 2000. The outer feedback path 380a, 380b, 380c comprises a multiplexer 385 for multiplexing the digital signals 1500a, 1500b, 1500c followed by the digital-to-analog converter 87 for converting the multiplexed baseband digital signal into said analog feedback signal 2000.

Contrary to the analog-to-digital converter of FIG. 2, digital up-conversion mixers are not needed on the outer feedback path 380a, 380b and 380c before multiplexing. Digital up-conversion occurs inherently by sub-sampling at a clock frequency, which is close to the band-pass frequency, creating an alias of the base band signal at the band-pass frequency.

Hence, the digital signal 1500a, 1500b, 1500c may be passed directly to the multiplexer 385.

The person skilled in the art will understand that the adder 12 of FIG. 1 is a non-limiting example of an adder block. The adder block 10 could be done by simply connecting two wires in parallel at the input of the mixer block, thereby adding the currents flowing through those two wires.

Figure 4:
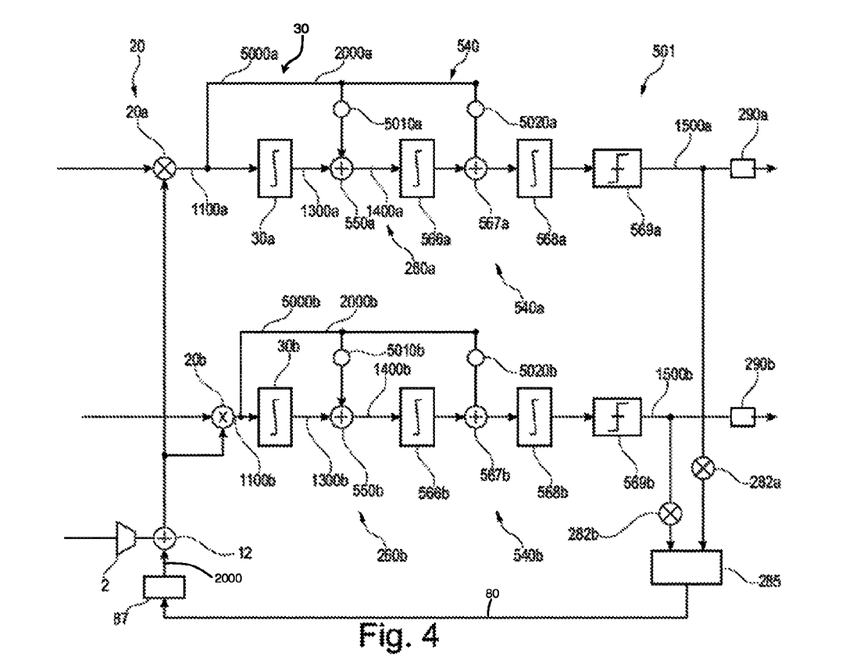
FIG. 4 shows a schematic block diagram of an analog-to-digital converter according to yet another of the aspect disclosure

FIG. 4 shows a schematic block diagram of an analog-to-digital converter 501 for receiving an analog band-pass signal according to another aspect of the invention. The analog-to-digital converter 501 of FIG. 4 mainly differs from the analog-to-digital converter 201 of FIG. 2 in that the quantization paths 240a, 240b with the inner feedback path 270a, 270b have been replaced by quantization paths 540a, 540b with feed forward branches 5000a, 5000b. In view of the similarities between the embodiments of FIGS. 2 and 4, only the differences will be explained in the following paragraphs.

The analog-to-digital converter 501 comprises a mixer block 20 similar to that of FIGS. 1 and 2 with an in-phase mixer 20a for providing an in-phase down-converted input component 1100a and a quadrature mixer 20b for providing a quadrature down-converted input component 1100b.

The outputs of the in-phase mixer 20a and the quadrature mixer 20b are connected to an integrator block 30. The output of the in-phase mixer 20a is connected to an in-phase integrator 30a and the output of the quadrature mixer 20b is connected to a quadrature integrator 30b.

The output of the in-phase integrators 30a is connected to an in-phase quantization path 540a for providing an in-phase delta sigma modulated signal component 1500a and the output of the and the quadrature integrator 30b is connected to a quadrature quantization path 540b for providing a quadrature delta sigma modulated signal component 1500b.

Each of the quantization path 540a, 540b comprises a delta sigma modulator adder or summation point 550a, 550b, a first integrator 566a, 566b followed by a second adder 567a, 567b, a second integrator 568a, 568b and a quantizer 569a, 569b, to generate a digital baseband signal 1500a, 1500b, and an feed forward path 5000a, 5000b.

The delta sigma modulator adder 550a, 550b is adapted to sum the filtered down-converted analog error signal component 1300a, 1300b and a feed forward signal 2000a, 2000b, and to output an updated input signal 1400a, 1400b to the at least one filter element 566a, 566b.

The feed forward signal 2000a, 2000b corresponds to the in-phase and quadrature down-converted input components 1100a, 1100b from the mixers 20a, 20b. The in-phase and quadrature down-converted input component 1100a, 1100b is also fed on the feed forward path 5000a, 5000b.

The feed forward path 5000a, 5000b is adapted to apply the feed forward signal 2000a, 2000b to the adders 550a, 550b and/or 567a, 567b, respectively. The feed forward path 5000a, 5000b comprises therefore a first gain module 5010a, 5010b with a first gain coefficient, and a second gain module 5020a, 5020b with a second gain coefficient.

The first gain coefficient and the second gain coefficient are gain coefficients that can be tuned to design the noise transfer function. The first gain coefficient and the second gain coefficient can be negative or positive. These branches apply the output signal of mixers 20a and 20b to adders 550a, 550b and/or 567a, 567b.

The feed forward signals can be taken from the output of adders 550a, 550b and/or 567a, 567b instead of taking them from the mixers 20a, 20b.

A combination of feed forward path and inner feedback path is possible. The feed forward signals can be applied to an optional additional adder between integrators 568*a*, 568*b* and quantizers 569*a*, 569*b*.

The analog-to-digital converters described in FIGS. 1-4 perform analog-to-digital conversion and frequency translation (down-conversion) simultaneously, if the at least one digital signal 1500*a*, 1500*b* is used as the digital output signal. Alternatively, the up-converted digital signal of the output feedback path 80 can be used as the output signal of the analog-to-digital converter. In this case, the analog-to-digital does not perform frequency translation (down-conversion) from analog input to digital output. This non-frequency translating application is also covered by all claims.

Figure 5:
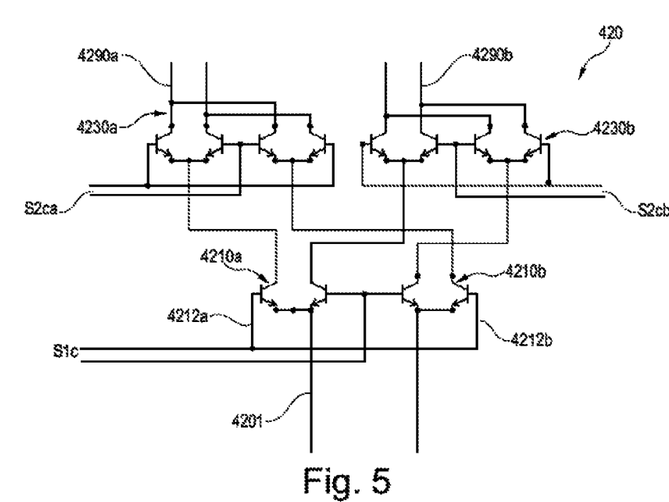
FIG. 5 shows a schematic block diagram of a possible mixer implementation which can be used with an analog-to-digital converter according to the disclosure.

FIG. 5 shows a schematic block diagram of a mixer 420, which can be used as mixer block 20 in FIGS. 1-4 inside an analog-to-digital converter according to the disclosure. The mixer 420 of FIG. 5 is an analog complex in phase and quadrature mixer block 420 which can be used in the analog-to-digital converter of FIG. 1 for example. The mixer 420 will be described with reference to the analog-to-digital converter of FIG. 1, as a non limiting example only.

The mixer 420 comprises a differential input 4201 for inputting the analog band-pass error signal 1100 from the adder 12 (FIGS. 1-4) to lower differential pairs 4210*a*, 4210*b*. The lower differential pairs 4210*a*, 4210*b* have a clock signal input 4212*a*, 4212*b* for feeding a first clock signal S1*c*.

The clock signal S1*c* is adapted to alternatatly steer the current from the adder 12 to an in-phase mixing quad 4230*a* and a quadrature mixing quad 4230*b*. The clock signal S1*c* has a frequency corresponding to twice the local oscillator LO frequency.

Each of the in phase and quadrature mixing quads 4230*a*, 4230*b* also receive second clock signals S2*ca*, S2*cb*, respectively. The second clock signals S2*ca*, S2*cb* have a frequency corresponding to the LO frequency. These lower speed second clock signals S2*ca*, S2*cb* are aligned to the first clock signal S1*c* in such a way that transitions between the local oscillator for the in phase and quadrature components occur while the corresponding in phase and quadrature switching quad 4230*a*, 4230*b* is off.

The in phase and quadrature baseband or intermediate frequency output currents are fed at the outputs 4290*a*, 4290*b* connected respectively to the in phase integrator 30*a* and quadrature integrator 30*b* of the analog-to-digital converter 1.

The mixer 420 has been described with reference to the analog-to-digital converter of FIGS. 1-4. It should be clear to the person skilled in the art that this is not a limiting example and that the mixer 420 can be used with other analog-to-digital converters as well.

FIG. 6 shows a schematic diagram of another mixer 851, which can be used as mixer block 20 in FIGS. 1-4 inside an analog-to-digital converter according to the disclosure. In literature, this mixer type is sometimes referred to as "multi-path mixer". The example of FIG. 6 shows a single-ended eight path mixer, but any other number of paths is possible. Eight preferably non-overlapping local oscillator signals or clock signals 801 to 808 are applied to the control inputs or gates 821 to 828 of transistors 821 to 828, to alternately connect the input port 831 to outputs 861 to 868.

FIG. 7 shows a schematic diagram of yet another mixer 950, which can be used as mixer block 20 in FIGS. 1-4 inside an analog-to-digital converter according to the disclosure. It is another example of a multi-path mixer, in this case a differential four-path mixer. The differential mixer can be constructed from two single-ended mixers 951 and 952. The differential input signal is connected to input nodes 931 and 932. Four preferably non-overlapping clock signals 901, 902, 903 and 904 are connected to gates 921, 922, 923, 924 of transistors 911, 912, 913 and 914 of one single-ended mixer 951. Clock signals 901, 902, 903 and 904 are also connected to gates 927, 928, 925, 926 of transistors 917, 918, 915 and 916 of one single-ended mixer 952. The four-phase output signal is available at output nodes 961, 962, 963 and 964. In the special case of a four-phase mixer, where the relative phase of signals 961, 962, 963 and 964 is 0°, 90°, 180° and 270°, these outputs can be interpreted as a differential in-phase output formed by nodes 961 and 963, and a differential quadrature output formed by nodes 962 and 964. However, any other number of paths, e.g. 3, 5, 6, 8, 12, 16 is also possible. The number of paths of the mixer is preferably matched to the number of quantization paths: In case of single-ended realizations of quantization paths, the number mixer paths is preferably equal to the number of quantization paths; in case of differential realizations of quantization paths, the number mixer paths is preferably equal to twice the number of quantization paths.

Figure 8:
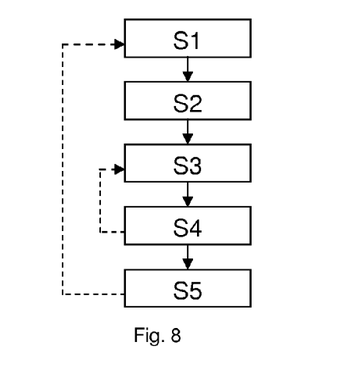
FIG. 8 is a block diagram of a method according to one aspect the disclosure.

FIG. 8 shows a block diagram of a method for processing an analog band-pass signal. The method is described in conjunction with the system of FIG. 1, but this is not a limiting example. It will be appreciated that the method can also be implemented using the analog-to-digital converters 1, 201, 301 and 501 of FIGS. 1-4.

In a first step S1, the method comprises the step of receiving, at the adder/input block 12, the analog band-pass signal 1000 and the outer analog feedback signal 2000, to form the analog band-pass error signal 1100.

The analog band-pass error signal 1100 is passed to the mixer block 20, to produce a down-converted analog error signal, at step S2. The mixer block of FIG. 1 is a complex I/Q mixer block, and the mixer blocks of FIG. 6-7 are multi-path mixers. However, these are not limiting examples and other configurations can be contemplated.

The down-converted analog error signal is thereafter delta sigma modulated, by at least one quantization path, to produce a digital output signal at step S3. The quantization path block 40 of FIG. 1 comprises a complex modulator block, with an in phase quantization block 40*a* for modulating the in phase component of the down-converted analog error signal, and a quadrature phase quantization block 40*a* for modulating the quadrature component of the down-converted analog error signal.

The digital signal is fed back into the delta sigma modulator block on the inner feedback path, at step S4. The output of the delta sigma modulator block 40 is fed on an inner feedback path for feeding back the at least one digital signal to the at least one filter element. The inner feedback path comprises an inner digital-to-analog converter.

The digital output signal is further fed back into the adder/input block at step S5. An outer common feedback path 80 provides the at least one digital signal back to the adder block 12, the outer feedback path 80 comprising a digital-to-analog converter 87 for converting the at least one digital signal into an analog feedback signal.

The method has therefore two feedback steps for improved dynamic range and loop gain.

The analog-to-digital converter is implemented as a chip using CMOS or SiGe. The person skilled in the art will note that the absence of capacitors inductors otherwise currently needed in prior art analog-to-digital converters allows reducing the size of the chip. This in turn implies cost and power savings.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modelling, simulation, description and/or testing of the apparatus and methods described herein. For example, this can be accomplished through the use of general program languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analog-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An analog-to-digital converter for converting an analog band-pass signal, comprising
   an adder/input block for receiving the analog band-pass signal and a analog band-pass feedback signal, thereby forming an analog band-pass error signal;
   at least one mixer block for down-converting the analog band-pass error signal, thus generating at least one down-converted analog error signal;
   at least one quantization path for generating at least one digital signal, wherein the at least one quantization path comprises
      at least one filter element
      at least one quantizer for generating at least one digital signal
      at least one of
         an inner feedback path for feeding back the at least one digital signal to the at least one filter element, wherein the inner feedback path comprises an inner digital-to-analog converter, or of
         a feed forward path for feeding forward the down-converted analog error signal to the at least one filter element; and
   an outer common feedback path for feeding the at least one digital signal back to the adder/input block, the outer feedback path comprising a digital-to-analog converter, to convert the at least one digital signal into a analog band-pass feedback signal.

2. The analog-to-digital converter according to claim 1, wherein the at least one filter element is an integrator.

3. The analog-to-digital converter according to claim 1, wherein the outer feedback path comprises a digital up-converter.

4. The analog-to-digital converter according to claim 1, comprising at least one filter element connected to the at least one mixer block and to the at least one quantization path.

5. The analog-to-digital converter according to claim 4, wherein the at least one filter element connected to the at least one mixer block and to the at least one quantization path is an integrator.

6. The analog-to-digital converter according to claim 1, wherein a ratio of the clock frequency of the outer feedback path to the band-pass frequency is at least one of approximately 4:1, 3:1, 3:2 or 4:3.

7. The analog-to-digital converter according to claim 1, comprising
   an in-phase mixer for providing an in-phase down-converted component and a quadrature mixer for providing a quadrature down-converted component, and
   an in-phase quantization path for providing an in-phase delta sigma modulated signal component and a quadrature quantization path for providing a quadrature delta sigma modulated signal component.

8. The analog-to-digital converter according to claim 1, comprising
   a multi-path mixer for providing at least three analog down-converted signals with at least three different phases, and
   at least three quantization paths for providing at least three delta sigma modulated signal components with at least three different phases, one quantization path for each down-converted signal of the multi-path mixer.

9. The analog-to-digital converter according to claim 1, comprising
   a multi-path mixer for providing at least four analog down-converted signals with at least four different phases, and
   at least two quantization paths for providing at least two delta sigma modulated signal components with at least two different phases, one quantization path for each pair of down-converted signal of the multi-path mixer.

10. The analog-to-digital converter according to claim 1, wherein the quantization path comprises a first filter element followed by a second filter element, and wherein the inner feedback path is adapted to feed back the digital output signal on an input of the first filter element and on an input of the second filter element.

11. The analog-to-digital converter according to claim 1, wherein the down-converted analog error signal is a baseband signal.

12. The analog-to-digital converter according to claim 1, wherein the down-converted analog error signal is an intermediate frequency signal.

13. The analog-to-digital converter according to claim 1, further comprising at least one decimation filter connected to the output of the at least one quantization path.

14. The analog-to-digital converter according to claim 1, wherein the analog-to-digital converter is implemented as a chip using CMOS or SiGe technology.

15. The analog-to-digital converter according to claim 1, comprising the feed forward path for feeding forward the down-converted analog error signal to the at least one filter element, wherein the quantization path comprises a first filter element followed by a second filter element, and wherein the feed forward path is adapted to feed the feed forward signal on at least one of an input of the first filter element or on an input of the second filter element.

16. The analog-to-digital converter according to claim 1, comprising the feed forward path for feeding forward the down-converted analog error signal to the at least one filter element, wherein the quantization path comprises a first filter element followed by a second filter element, the feed forward path being connected between the mixer block and at least one of the first filter element or the second filter element.

17. The analog-to-digital converter according to claim 1, comprising the feed forward path for feeding forward the down-converted analog error signal to the at least one filter element, comprising at least one filter element connected to the at least one mixer and to the quantization path, wherein the quantization path comprises a first filter element followed by a second filter element, the feed forward path being connected between said at least one filter element and at least one of the first filter element or the second filter element.

18. The analog-to-digital converter according to claim 1, wherein the outer common feedback path comprises at least two digital-to-analog converters for excess loop delay compensation.

19. A method for processing an analog band-pass signal, comprising the steps of
receiving, at an input block, the analog band-pass signal and a feedback signal to form an analog band-pass error signal;
down-converting the analog band-pass error signal to produce a down-converted analog error signal;
delta sigma modulating, by a quantization block having a quantization path, the down-converted analog error signal to produce a digital output signal, wherein the delta sigma modulating comprises at least one of feeding back the digital signal into the quantization block or feeding forward the analog band-pass error signal to the at least one filter element; and
feeding back the digital output signal as the band-pass feedback signal to the input block.

* * * * *